United States Patent
Jo (10) Patent No.: US 6,553,520 B1
(45) Date of Patent: Apr. 22, 2003

(54) INTEGRATED CIRCUIT DEVICES WITH MODE-SELECTIVE EXTERNAL SIGNAL ROUTING CAPABILITIES AND METHODS OF OPERATION THEREFOR

(75) Inventor: Seong-kue Jo, Kyungki-do (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 09/368,035

(22) Filed: Aug. 3, 1999

(30) Foreign Application Priority Data

Aug. 13, 1998 (KR) ............................................ 98-32892

(51) Int. Cl.⁷ .............................................. G11C 29/00
(52) U.S. Cl. ...................................... 714/718; 365/201
(58) Field of Search ................................ 714/718, 724

(56) References Cited

U.S. PATENT DOCUMENTS

| | | | |
|---|---|---|---|
| 5,535,165 A | | 7/1996 | Davis et al. ................. 365/201 |
| 5,677,877 A | | 10/1997 | Yoon et al. ............ 365/189.02 |
| 5,764,592 A | * | 6/1998 | McClure ................... 365/233.5 |
| 5,802,071 A | * | 9/1998 | Fang et al. .................... 714/724 |
| 6,016,534 A | * | 1/2000 | Kumar et al. ................. 711/154 |
| 6,094,734 A | * | 7/2000 | Beffa et al. .................. 714/718 |
| 6,016,413 A | * | 12/2000 | Habersetzer et al. ......... 324/763 |

FOREIGN PATENT DOCUMENTS

| | | |
|---|---|---|
| EP | 0 801 400 A1 | 10/1997 |
| EP | 0 801 401 A1 | 10/1997 |
| GB | 2 327 506 A | 1/1999 |
| JP | Hei-10-214498 | 8/1998 |
| KR | 97-77410 | 12/1997 |

OTHER PUBLICATIONS

Search Report, GB 9918766.8, Date of Search: Jan. 26, 2000.
Notice to Submit Response, Korean Application No. 10–1998–0032892, Oct. 27, 2000.

* cited by examiner

Primary Examiner—Albert DeCady
Assistant Examiner—Cynthia Harris
(74) Attorney, Agent, or Firm—Myers Rigel Sibley & Sajovec (57) ABSTRACT

An integrated circuit device includes a package and an externally accessible signal lead attached to the package. An integrated circuit chip is mounted in the package and connected to the signal lead. The integrated circuit chip includes a mode-selective signal generating circuit configured to receive a mode control signal and an internal signal and coupled to the externally accessible signal lead. The mode-selective signal generating circuit is operative to produce an output signal responsive to one of the internal signal or an external signal applied to the externally accessible signal lead based on the mode control signal. According to an embodiment, the integrated circuit chip further includes a memory circuit including a sense amplifier that senses a bit line voltage in response to a sense enable signal. The internal signal includes a sense enable control signal having a timing adapted for sensing a bit line voltage in a memory cycle of the memory circuit. The mode-selective signal generating circuit is operative to generate the sense enable signal responsive to one of the sense enable control signal or the external signal based on the mode control signal. In another embodiment, the internal signal includes an internally-generated reference signal produced at a reference signal bus, and the mode-selective signal generating circuit includes a transfer gate coupling the externally accessible signal lead to the reference voltage node and operative to apply a voltage applied to the externally accessible signal lead to the reference signal bus responsive to the mode control signal. Related operating methods are also provided.

13 Claims, 8 Drawing Sheets

INTEGRATED CIRCUIT DEVICES WITH MODE-SELECTIVE EXTERNAL SIGNAL ROUTING CAPABILITIES AND METHODS OF OPERATION THEREFOR

FIELD OF THE INVENTION

The present invention relates to integrated circuit devices and methods of operation thereof, and more particularly, to apparatus and methods for testing integrated circuit devices.

BACKGROUND OF THE INVENTION

In order to ensure reliability and proper operation of integrated circuit devices, such as memory devices, manufacturers typically perform a variety of tests on internal circuits in the devices. An example of such a test is a bit line sensing test, which is usually important in verifying proper operation of an integrated circuit memory device such as a DRAM.

A typical bit line sensing process is performed as follows. Data stored in a memory cell is transmitted to a bit line through a charge sharing operation performed by the activation of the word line connected to the memory cell. A difference between the voltage of the bit line to which the data of the memory cell is transmitted and the precharge voltage of a complementary bit line is amplified by a sense amplifier, producing a signal with a logic "high" or "low" value. The time at which the sense amplifier operates typically is critical to the operation of the memory device. In order to improve the operating characteristics of the semiconductor device, it is generally important that the sense amplifier operates at an optimal or near optimal time. Therefore, memory devices commonly include a test mode for determining the time at which the sense amplifier operates in response to a test signal applied to a pad of the integrated circuit memory device.

Another common test for a memory device involved determining whether voltage generating circuits of the device operate appropriately. Many kinds of internal voltage generating circuits may be used in memory devices. Test pads may be also be provided in the integrated circuit chip for testing the various internal voltage generating circuits at the wafer stage.

It generally is infeasible to connect such internal test signal pads to external leads when the integrated circuit device is packaged, however, due to limitations on the number of available external leads. Consequently, pads for applying test signals or for monitoring signals may not be connected to external leads of the packaged device.

SUMMARY OF THE INVENTION

In light of the foregoing, it is an object of the present invention to provide packaged integrated circuit devices and operating methods that allow for testing of internal functions from external signal leads.

This and other objects, features and advantages are provided according to the present invention by integrated circuit devices and operating methods in which an external signal lead of a packaged integrated circuit device is coupled to an integrated circuit chip including a mode-selective signal generating circuit that is operative to generate a signal responsive to either an external signal applied to the external signal lead or an internal signal generated by a signal generating circuit on the chip. According to an embodiment of the present invention, a sense enable signal for a memory sense amplifier is generated responsive to one of an external signal applied to an external lead or an internal sense enable control signal generated on the chip. According to another embodiment of the present invention, a reference voltage is generated responsive to one of an external signal applied to an external lead or an internally generated reference voltage.

In particular, according to the present invention, an integrated circuit device includes a package and an externally accessible signal lead attached to the package. An integrated circuit chip is mounted in the package and connected to the signal lead. The integrated circuit chip includes a mode-selective signal generating circuit configured to receive a mode control signal and an internal signal and coupled to the externally accessible signal lead. The mode-selective signal generating circuit is operative to produce an output signal responsive to one of the internal signal or an external signal applied to the externally accessible signal lead based on the mode control signal.

According to an embodiment of the present invention, the integrated circuit chip further includes a memory circuit including a sense amplifier that senses a bit line voltage in response to a sense enable signal. The internal signal includes a sense enable control signal having a timing adapted for sensing a bit line voltage in a memory cycle of the memory circuit. The mode-selective signal generating circuit is operative to generate the sense enable signal responsive to one of the sense enable control signal or the external signal based on the mode control signal. The mode-selective signal generating circuit may be operative to generate the sense enable signal responsive to the sense enable control signal when the mode control signal is in a first state and to generate the sense enable signal responsive to the external signal when the mode control signal is in a second state.

According to a related aspect of the present invention, the chip further includes a conductive pad electrically connected to the mode-selective gating circuit. The mode-selective signal generating circuit is operative to generate the sense enable signal responsive to one of the sense enable control signal or a signal applied to the conductive pad based on the mode control signal.

According to yet another embodiment, the mode-selective gating circuit includes a selective test signal generating circuit connected to the externally accessible signal lead and to the conductive pad and operative to generate a test signal responsive to one of an external signal applied to the externally accessible signal lead and a signal applied to the conductive pad. A gating circuit configured to receive the test signal, the sense enable control signal and the mode control signal, and operative to generate the sense enable signal responsive to one of the test signal and the sense enable control signal based on the mode control signal. The selective test signal generating circuit may include a first NAND gate configured to receive the mode control signal and the external signal at inputs thereof and to produce an output signal therefrom at an output of the first NAND gate, a second NAND gate having a first input connected to the output of the first NAND gate, a pulldown transistor connected between the conductive pad and a signal ground, and an inverter having an input connected to the conductive pad and an output connected to a second input of the second NAND gate. The second NAND gate generates the test signal at an output thereof.

According to another aspect of the present invention, the chip further includes a mode control signal generating circuit operative to generate the mode control signal. The mode control signal generating circuit may be responsive to a reset signal, a test reset signal, and an address signal. The mode control signal generating circuit may be operative to reset the mode control signal to the first state in response to the reset signal and to latch the mode control signal to a value dependent upon a value of the address signal when the test reset signal is asserted.

In yet another embodiment, the internal signal includes an internally-generated reference signal produced at a reference signal bus, and the mode-selective signal generating circuit includes a transfer gate coupling the externally accessible signal lead to the reference voltage node and operative to apply a voltage applied to the externally accessible signal lead to the reference signal bus responsive to the mode control signal.

Related operating methods are also provided.

DETAILED DESCRIPTION OF PREFERRED EMBODIMENTS

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. Like numbers refer to like elements throughout. Moreover, each embodiment described and illustrated herein includes its complementary logic type embodiment as well.

Figure 1:
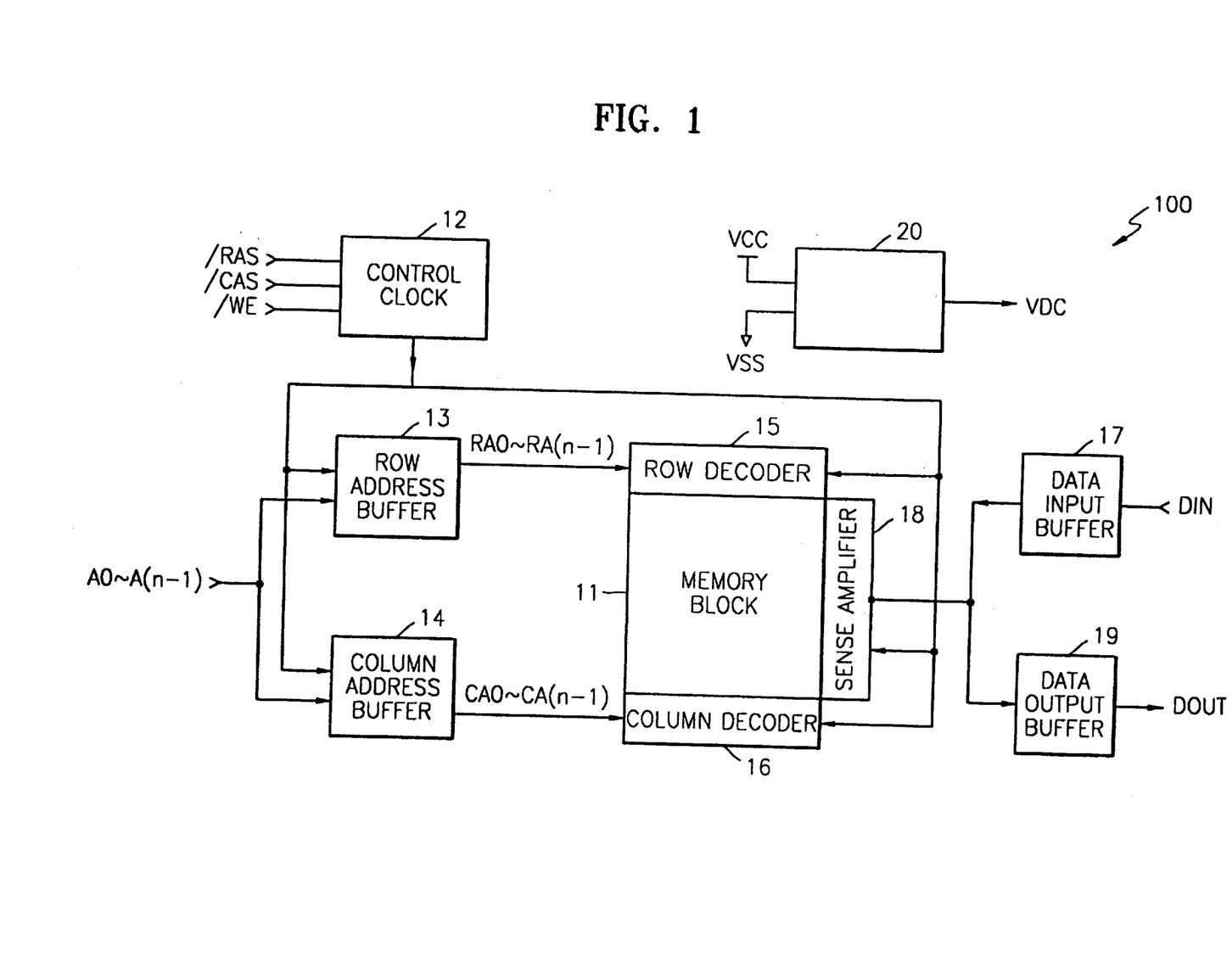
FIG. 1 is a block diagram illustrating an exemplary integrated circuit memory device.

FIG. 1 is a block diagram illustrating an exemplary integrated circuit memory device 100. Referring to FIG. 1, a memory block 11 includes a plurality of memory cells arranged in rows and columns. A control clock 12 provides signals for controlling circuits in the semiconductor memory device responsive to a row address strobe signal (/RAS), a column address strobe signal (/CAS), and a write enable signal (/WE), applied from outside the memory device 100.

A row address buffer 13 generates row addresses RA0 through RA(n−1) by buffering addresses A0 through A(n−1) input generated by a row addressing section, i.e., a section in which the /RAS is activated. A column address buffer 14 generates column addresses CA0 through CA(n−1) by buffering addresses A0 through A(n−1) input from a column addressing section, i.e., a section in which the /CAS is activated. A row decoder 15 selects the row of the memory block 11 based on the row addresses RA0 through RA(n−1) provided by the row address buffer 13, and a column decoder 16 selects the column of the memory array 11 based on the column addresses CA0 through CA(n−1) provided by the column address buffer 14. In this manner, a specific memory cell may be selected in the memory block 11 by the row decoder 15 and the column decoder 16.

When the semiconductor memory device is in a write mode, i.e., when the /RAS, the /CAS, and the /WE are "low," a data input buffer 17 buffers input data DIN, conveying the input data DIN to a sense amplifier 18 that senses and amplifies the input data DIN and stores the data in a selected memory cell. When the semiconductor memory device is in a read mode, i.e., when /RAS and /CAS are "low" and /WE is "high," the sense amplifier 18 senses and amplifies data from a selected memory cell and transfers the data to a data output buffer 19 that outputs the data from the memory device 100.

An internal voltage generating circuit 20 receives a power voltage VCC and a ground voltage VSS and generates a reference voltage VDC. Although one internal voltage generating circuit 20 is representatively shown, it will be understood that memory devices such as the device 100 may include various kinds of internal voltage generating circuits generating various internal voltages, e.g., back bias voltage (VBB) generators and the like.

Figure 2:
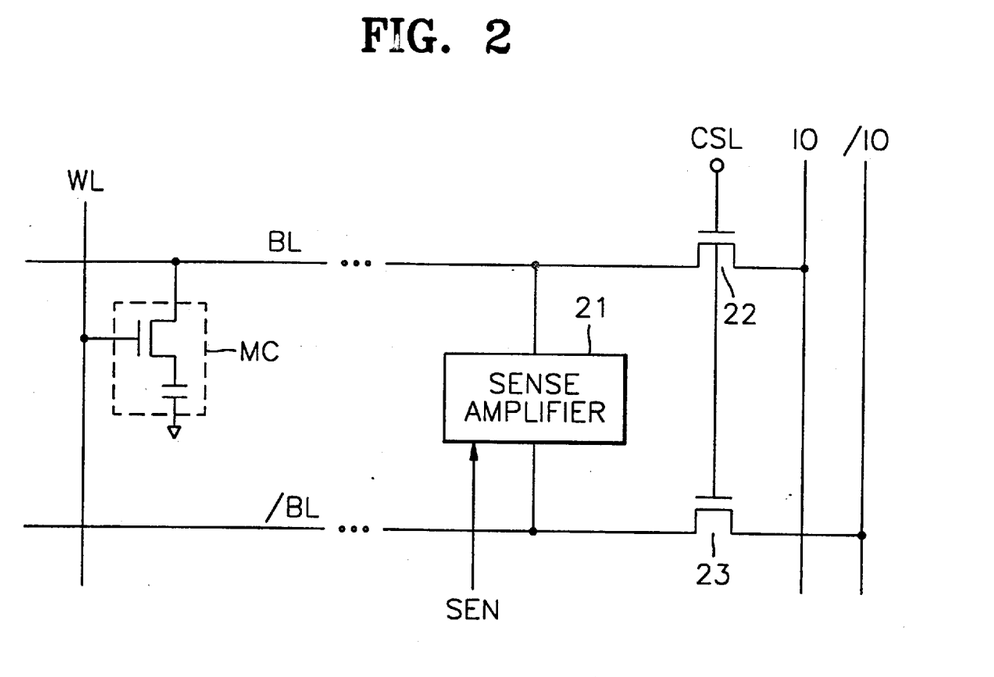
FIG. 2 is a schematic diagram illustrating bit lines, sense amplifier, and other circuits of the integrated circuit memory device of FIG. 1.

Referring to FIG. 2, when a word line WL is activated by the row addresses RA0 through RA(n−1) output from the row address buffer 13 (refer to FIG. 1), the data of the memory cell MC connected to the selected word line WL is transferred to the bit line BL. At this time, a complementary bit line /BL has a predetermined precharge voltage VREF. A difference between the voltage of the data transferred to the bit line BL and the precharge voltage VREF is sensed and amplified by a sense amplifier 21. The sense amplifier 21 starts responsive to a sensing enable signal SEN.

Figure 3:
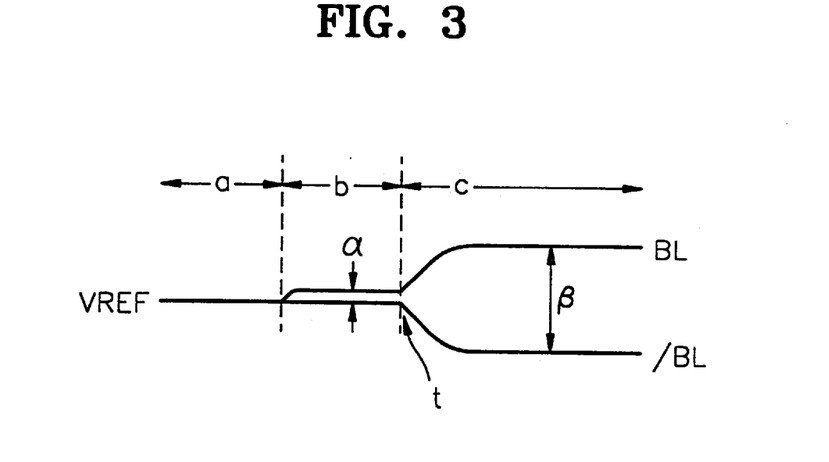
FIG. 3 is a graph illustrating generation and amplification of bit line voltages.

Referring to FIG. 3, bit line BL and complementary bit line /BL are precharged to a precharge voltage VREF before the word line is activated in a section a. The data of the memory cell MC is transferred to the bit line BL by the activation of the word line WL in a section b. A voltage difference of α is generated between the bit line BL and the complementary bit line /BL by charge sharing in the section b. The sense amplifier 21 is driven in a section c. The voltage difference α between the bit line BL and the complementary bit line /BL is sensed and amplified to a voltage difference of β in the section c, in response to assertion of the sensing enable signal SEN at a time t. Referring back to FIG. 2, when a specific column select line CSL is activated by the column addresses CA0 through CA(n−1) output from a column address buffer 14 (refer to FIG. 1), the data of the pair of bit lines BL and /BL are transferred to input and output lines IO and /IO by transferring transistors 22 and 23.

Figure 4:
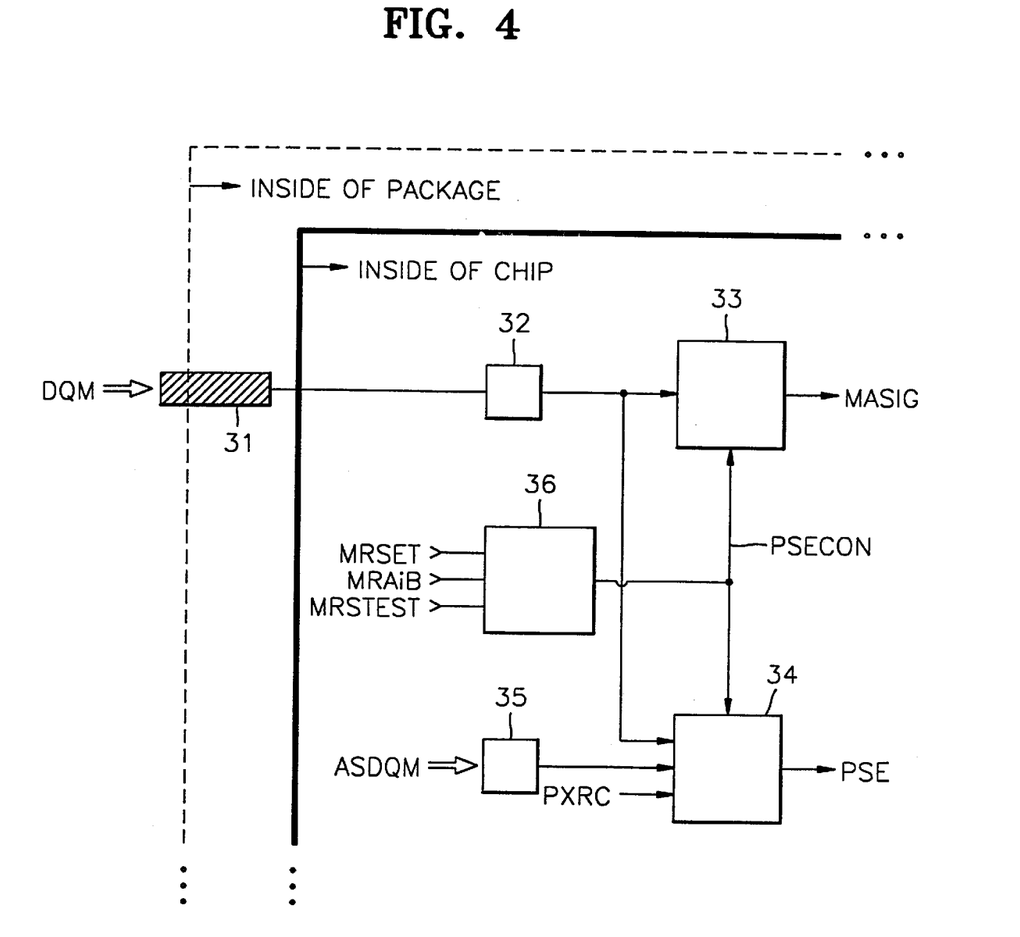
FIG. 4 is a block diagram illustrating an integrated circuit device according to an embodiment of the present invention.

FIG. 4 illustrates portions of a packaged integrated circuit device 400 according to an embodiment of the present invention. A conductive pad 32 on an integrated circuit chip 410 is electrically connected to an externally accessible signal lead 31 of the packaged device 400, and receives a test signal DQM applied to the signal lead 31. A mode-selective signal generating circuit 34 generates a signal PSE, e.g., a control signal such as the sense enable signal SEN of FIG. 2, responsive to one of an internal sense enable control signal PXRC (a signal adapted to provide bit line sensing in the memory device 400) or the external test signal DQM, based on the state of a mode control signal PSECON. The mode-selective signal generating circuit 34 produces the signal PSE in response to the test signal DQM input through the conductive pad 32 when the device 400 is in a test mode.

Figure 5:
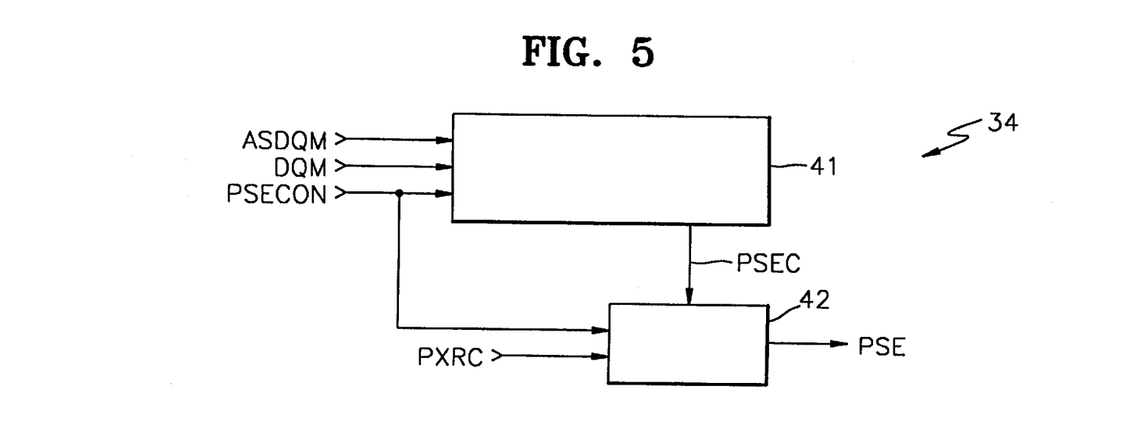
FIG. 5 is a schematic diagram illustrating a mode-selective signal generating circuit according to an embodiment of the present invention.

Referring to FIG. 5, the signal generating circuit 34 includes test signal generating circuit 41 and a gating circuit 42. The test signal generating circuit 41 is responsive to a mode control signal PSECON that indicates whether the device 400 is in a "normal" or a "test" mode. The test signal generating circuit 41 generates an output signal PSEC in response to the external test signal DQM and/or a test signal ASDQM applied to an internal pad 35, typically in wafer stage testing.

Figure 6:
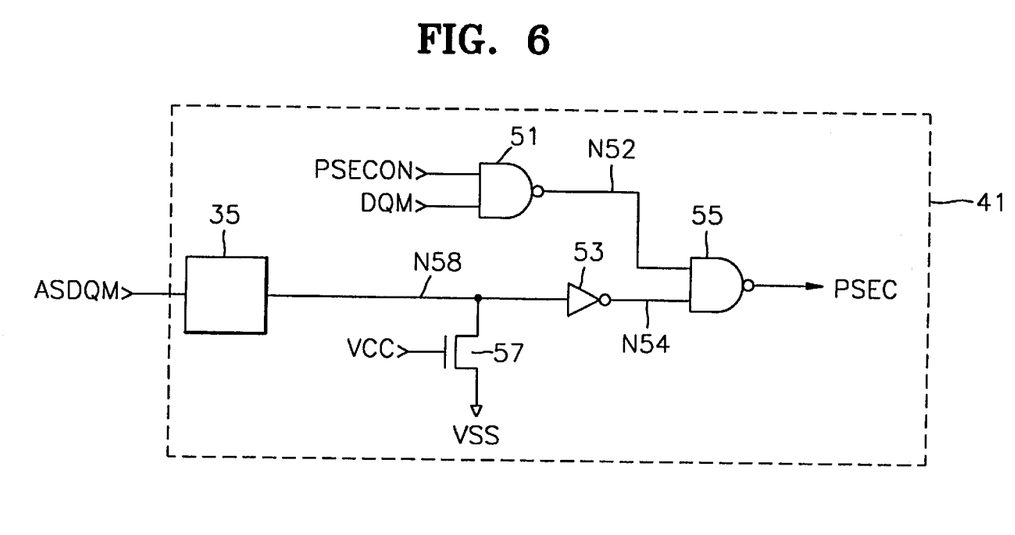
FIG. 6 is a schematic diagram illustrating a test signal generating circuit according to an embodiment of the present invention.

Referring to FIG. 6, a first NAND logic gate 51 generates output signal N52 "low" in response to the transition of the test signal DQM "high." When the output signal N52 is "low," the output signal PSEC, which is produced by a second NAND logic gate 55, goes "high." Preferably, the test signal generating circuit 41 further includes an internal pad 35. The internal pad 35 receives an auxiliary test signal ASDQM in a wafer state. A buffer 53 buffers the auxiliary test signal ASDQM applied to the internal pad 35.

When the auxiliary test signal ASDQM is "high," an output signal N54 from the buffer 53 goes "low." The second NAND logic gate 55 NANDs the output signal N52 with the output signal N54, generating the output signal PSEC. Therefore, the output signal PSEC goes "high," regardless of the logic state of the output signal N52. Thus, it is possible to control the output signal PSEC through the auxiliary test signal ASDQM to the internal pad 35.

The test signal generating circuit 41 further includes a precharging transistor 57, preferably an NMOS transistor having a power supply voltage VCC applied to its gate, a source terminal connected to a ground voltage VSS, and a drain terminal connected to an input N58 of the buffer 53. The NMOS transistor 57 preferably has a low conductance, such that the logic state of the input N58 of the buffering portion 53 is determined by the auxiliary test signal ASDQM when such a signal is present. However, when there is no signal applied at the internal pad 35, the logic state of the input N58 of the buffer 53 approaches the ground voltage VSS.

Figure 7:
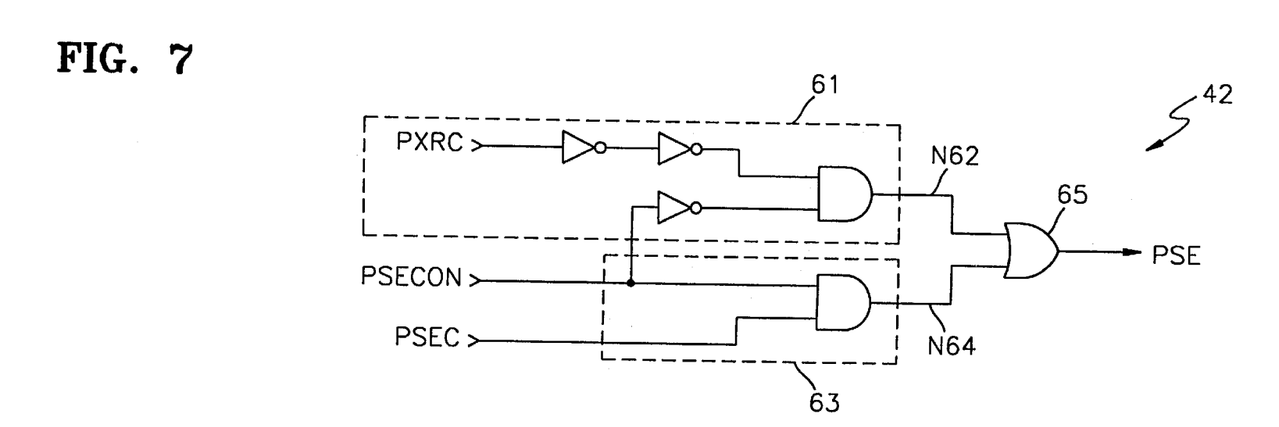
FIG. 7 is a schematic diagram illustrating a gating circuit according to an embodiment of the present invention.

Referring to FIG. 7, the gating circuit 42 produces the sense enable signal PSE responsive to the output signal PSEC when the mode control signal PSECON is in a "high" state, corresponding to the test mode. Thus, in test mode, the output signal PSE is produced responsive to one of the external test signal or the wafer-stage test signal ASDQM in the test mode. Conversely, when the device is in the "normal mode," i.e., when PSECON is "low," the output signal PSE is produced responsive to the internal sense enable control signal PXRC. A first subcircuit 61 of the gating circuit 42 gates the internal sense enable control signal PXRC with the mode control signal PSECON, producing a first output signal N62. A second subcircuit 63 of the gating circuit 42 gates the output signal PSEC with the mode control signal PSECON, producing a second output signal N64. The output signals N64, N64 are then logically combined in an OR gate 65 to produce the sense enable signal PSE.

As the sense enable signal PSE drives the sense amplifier 21 of FIG. 2, the sense amplifier 21 starts begins sensing a bit line voltage in response to assertion of the sense enable control signal PXRC in the normal mode. In test mode, however, the sense amplifier begins sensing of a bit line voltage in response to assertion of the test signal DQM input through the external signal lead 31 or the auxiliary test signal ASDQM input through the conductive pad 35.

Figure 8:
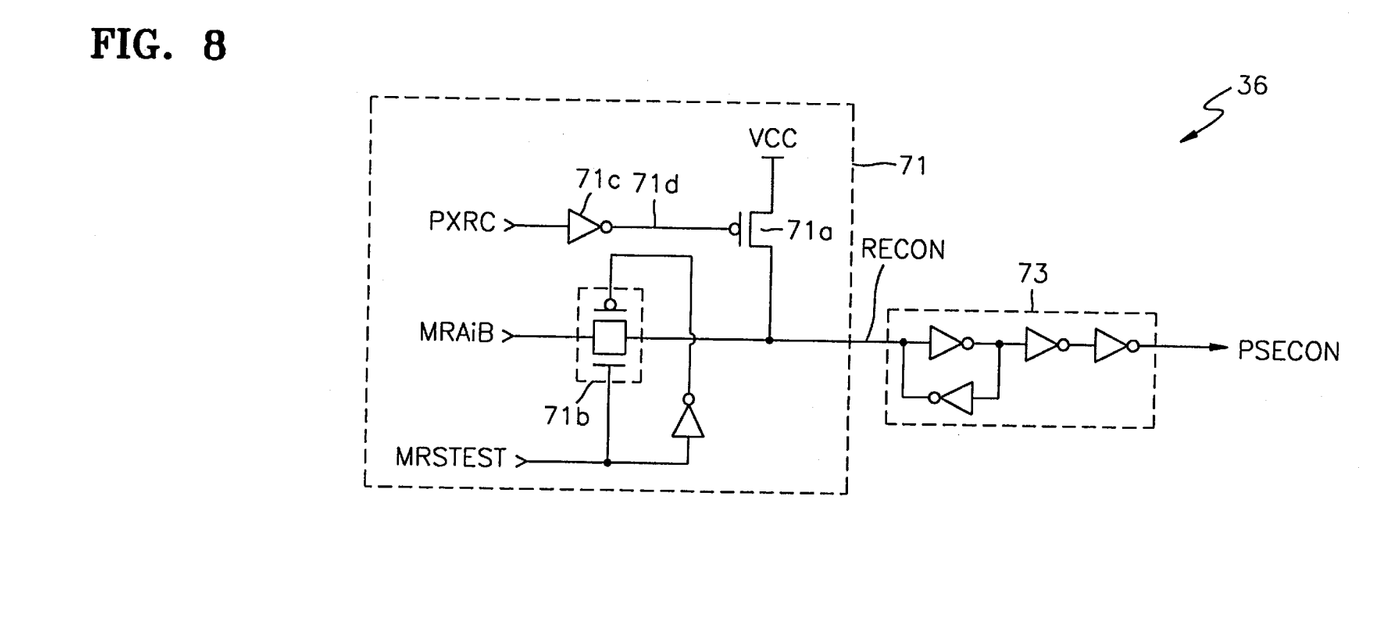
FIG. 8 is a schematic diagram illustrating a mode control signal generating circuit according to an embodiment of the present invention.

Referring to FIG. 4, the device 400 further includes a mode control signal generating circuit 36 that produces the mode control signal PSECON. As illustrated in FIG. 8, the mode control signal generating circuit 36 may include a first subcircuit 71 that produces an output signal RECON that is latched by an inverting latching circuit 73. The subcircuit 71 includes a pull-up transistor 71a and a transfer gate 71b. The pull-up transistor 71a pulls the control respond signal RECON up to a power supply voltage VCC in response to a reset signal MRSET, preferably a pulse asserted "high" when the device is commanded to the normal mode. When the reset signal MRSET is asserted "high," an output 71d signal of an inverter 71c goes to "low," turning on the pull-up transistor 71a and driving the output signal RECON near the power supply voltage VCC. The mode control signal PSECON is latched to the inverse of the value of RECON when the reset signal MRSET is again taken "low." Accordingly, in the normal mode, the output signal RECON is "high." The normal reset signal MRSET generated in a "high" phase disables internal signals related to the test mode when a mode register setting (MRS) command is given in the normal mode. The transfer gate 71b conveys an address signal MRAiB in response to assertion of a test reset signal MRSTEST to a logic "high," thus driving the output signal RECON to the value of the address signal MRAiB. As the test reset signal MRSTEST preferably is a pulse asserted "high" upon entry into the test mode, the mode control signal PSECON is latched to the inverse of the value of the address signal MRAiB at the time the MRSTEST signal.

Figure 9:
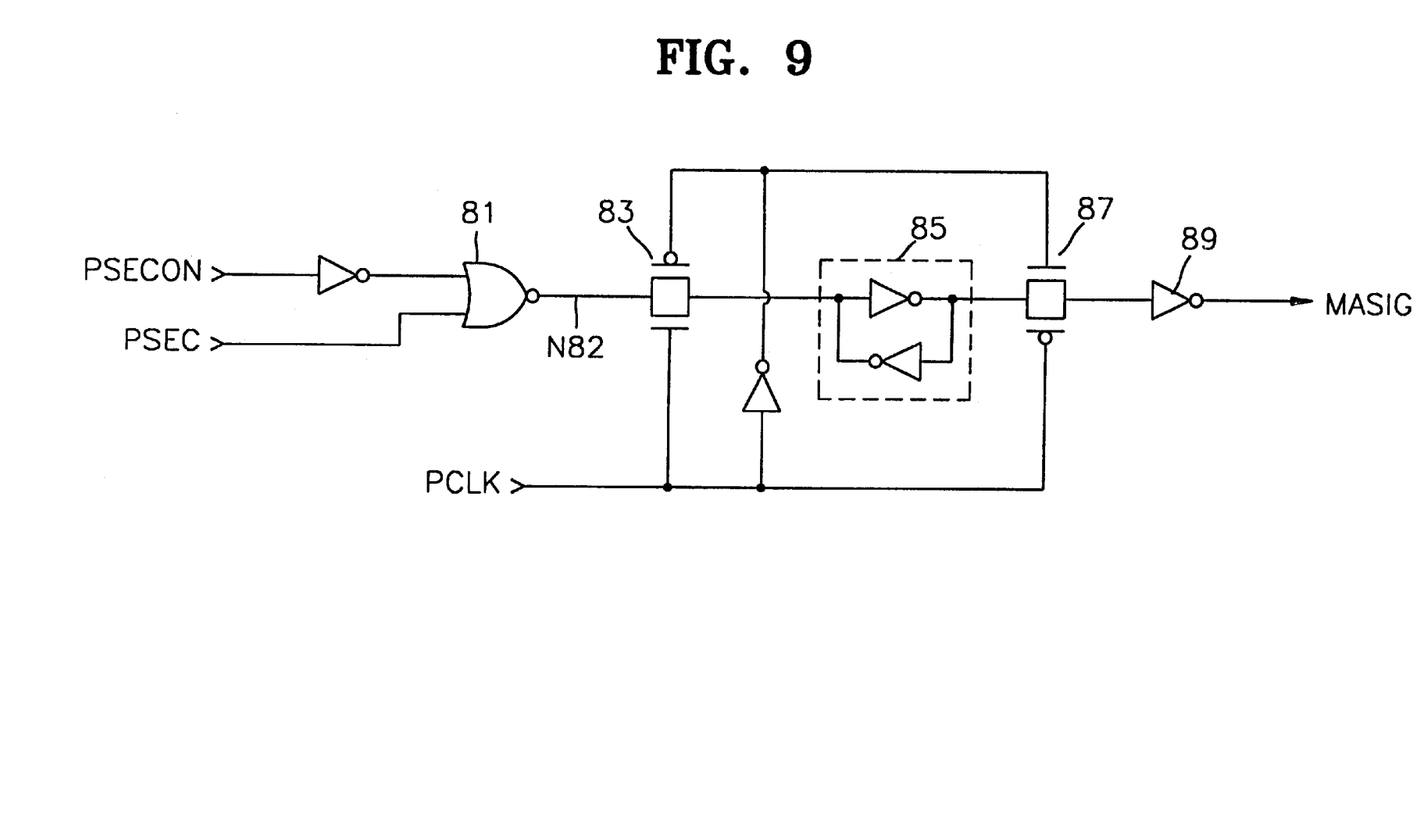
FIG. 9 is a schematic diagram illustrating a mode-selective signal generating circuit according to an embodiment of the present invention.

FIG. 9 illustrates a circuit 33 for removing the influence of the test signal DQM during the test operation. As mentioned above, the control signal PSECON is "high" in the test mode. Then, an output N82 signal of a NOR gate 81 is "low" regardless of the logic state of the test signal DQM. A transfer gate 83 is turned "on" at the rising edge of the internal clock signal PCLK. Accordingly, the output N82 of the NOR gate 81 is inverted and latched to "high" to a latching portion 85. A transfer gate 87 is turned "on" at the rising edge of the internal clock signal PCLK. At this time, an output N86 of the latching portion 85 is transferred to an inverter 89. The signal MASIG output signal from the inverter 89 is "low" in the test mode, regardless of the logic state of the test signal DQM. In the normal mode, the control signal PSECON is "low," and signal MASIG is responsive to the test signal DQM.

Figure 10:
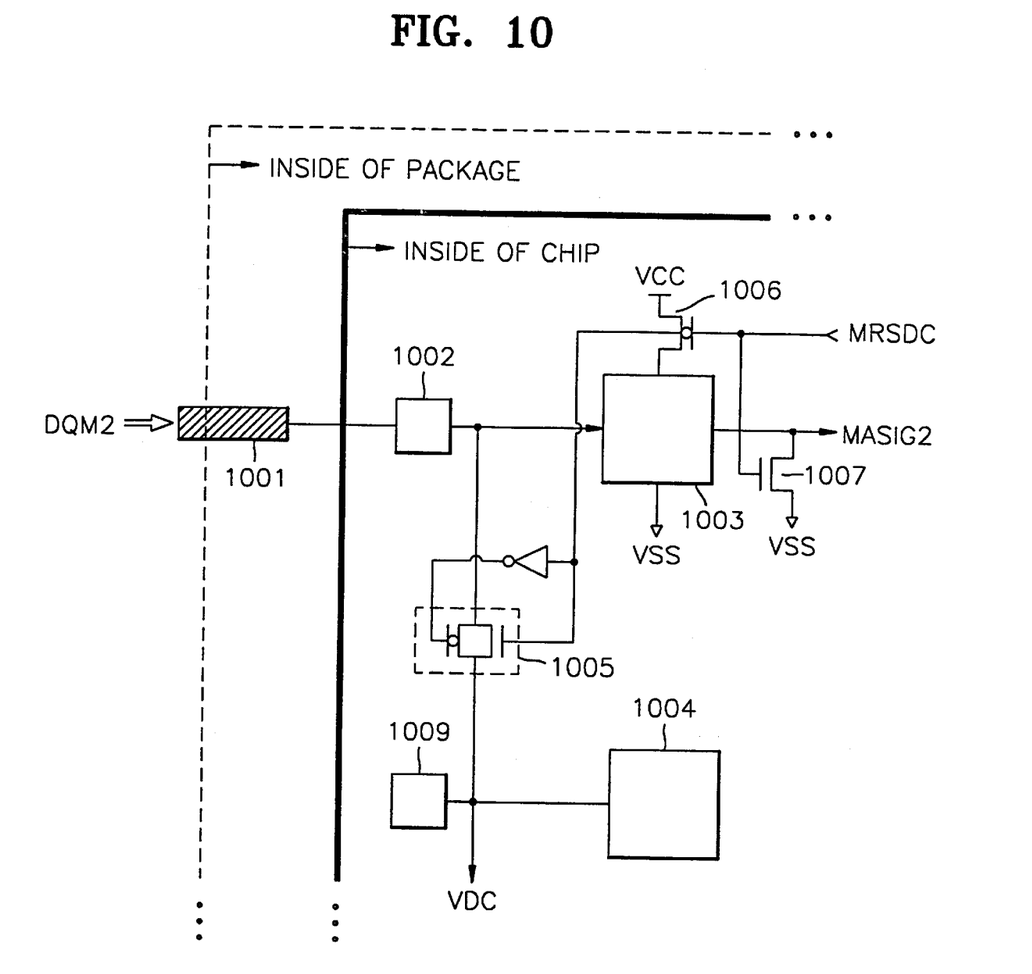

FIG. 10 illustrates another embodiment of an integrated circuit device according to the present invention, in particular, a packaged integrated circuit device 1000 including a chip 1010 with an internal reference signal generating circuit 1004. A pad 1002 is connected to an external signal lead 1001 in the packaged device 1000. A main signal generating circuit 1003 is driven in response to a test signal DQM2 input through the pad 1002 in a normal mode. In an internal voltage mode, the reference signal generating circuit 1004 provides a reference signal VDC, which may be used, for example, as a back bias voltage or step-up voltage. In an external voltage mode, a test signal DQM2 applied through the outside connection pad 1002 is used as the reference signal VDC.

In the external voltage mode, a transfer gate 1005 is turned "on" when a control signal MRSDC is "high,"

electrically connecting the pad 1002 to output of the reference signal generating circuit 1004. With the control signal MRSDC "high," the PMOS transistor 1006 is turned "off," de-energizing the signal generating circuit 1003. An NMOS transistor 1007 is turned "on," and the output signal MASIG2 is taken "low." In the internal voltage mode, the control signal MRSDC goes to "low," turning "off" the transfer gate 1005, turning the PMOS transistor 1006 "on" and turning the NMOS transistor 1007 "off." The main signal generating circuit 1003 generates the main signal MASIG2 in response to the test signal DQM2.

Preferably, the chip 1010 further includes pad 1009 at which a reference voltage VDC can be directly applied. Preferably, the transfer gate 1005 is designed to have a large conductance value, thus reducing the influence of a voltage generated by the reference signal generating circuit 1004 in the external voltage mode.

Figure 11:
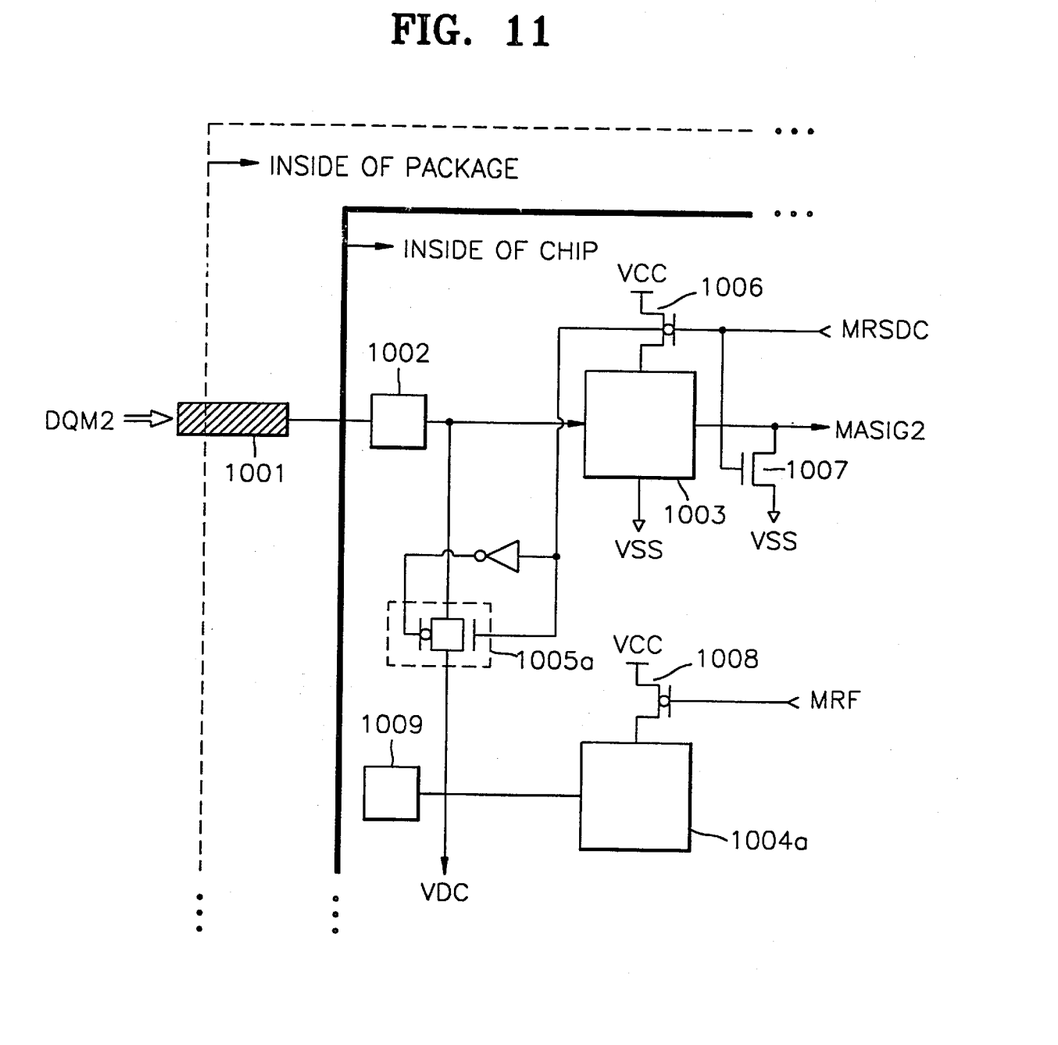

FIG. 11 illustrates yet another embodiment according to the present invention, in particular, an integrated circuit device 1100 representing a modification of the device 1000 of FIG. 10. The device 1100 differs from the device 1000 of FIG. 10 in that a pull-up transistor 1008 is connected between the reference signal generating circuit 1004a and the power supply voltage VCC. Thus, in the external voltage mode, a second application control signal MRF applied to the gate of the transistor 1008 is taken "high," turning off pull-up transistor 1008 and de-energizing the reference signal generating circuit 1004a. In this manner, the influence of the voltage generated by the reference signal generating circuit 1004a is removed in the external voltage mode.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. An integrated circuit device, comprising:
   a package;
   an externally accessible signal lead attached to said package; and
   an integrated circuit chip mounted in said package and connected to said externally accessible signal lead, said integrated circuit chip including:
   a memory circuit including a sense amplifier that senses a bit line voltage in response to a sense enable signal;
   a mode-selective signal generating circuit coupled to said externally accessible signal lead and configured to receive a mode control signal and a sense enable control signal having a timing adapted for sensing a bit line voltage in a memory cycle of said memory circuit wherein said mode-selective signal generating circuit is operative to generate said sense enable signal responsive to one of said sense enable control signal or an external signal applied to said externally accessible signal lead based on said mode control signal.

2. A device according to claim 1, wherein said mode-selective signal generating circuit is operative to generate said sense enable signal responsive to said sense enable control signal when said mode control signal is in a first state and to generate said sense enable signal responsive to said external signal when said mode control signal is in a second state.

3. A device according to claim 2, wherein said chip further comprises a mode signal generating circuit operative to generate said mode control signal.

4. A device according to claim 3, wherein said mode control signal generating circuit comprises a mode control signal latching circuit configured to receive a reset signal, a test reset signal, and an address signal, said mode control latching circuit operative to reset said mode control signal to said first state in response to said reset signal and to latch said mode control signal to a value dependent upon a value of said address signal when said test reset signal is asserted.

5. A device according to claim 4, wherein said mode control latching circuit comprises:
   an input section comprising:
      an output node;
      a pullup transistor including first and second controlled electrode connected between said output node and a power supply bus, said pullup transistor including a controlling electrode coupled to said reset signal; and
      a transfer gate coupling said address signal and said output node and first and second complementary controlling electrodes electrically coupled to said test reset signal; and
   a latching section coupled to said output node of said input section, said latching section producing said mode control signal at an output node thereof.

6. A device according to claim 1:
   wherein said chip further comprises a conductive pad electrically connected to said mode-selective signal generating circuit; and
   wherein said mode-selective signal generating circuit is operative to generate said sense enable signal responsive to one of said sense enable control signal or a signal applied to said conductive pad based on said mode control signal.

7. A device according to claim 6, wherein said mode-selective signal generating circuit comprises:
   a selective test signal generating circuit connected to said externally accessible signal lead and to said conductive pad and operative to generate a test signal responsive to one of an external signal applied to said externally accessible signal lead and a signal applied to said conductive pad; and
   a gating circuit configured to receive said test signal, said sense enable control signal and said mode control signal, and operative to generate said sense enable signal responsive to one of said test signal and said sense enable control signal based on said mode control signal.

8. A device according to claim 7, wherein said selective test signal generating circuit comprises:
   a first NAND gate configured to receive said mode control signal and said external signal at inputs thereof and to produce an output signal therefrom at an output of said first NAND gate;
   a second NAND gate having a first input connected to said output of said first NAND gate;
   a pull-down transistor connected between said conductive pad and a signal ground; and
   an inverter having an input connected to said conductive pad and an output connected to a second input of said second NAND gate,
   wherein said second NAND gate generates said test signal at an output thereof.

9. An integrated circuit device, comprising:
   a package;
   an externally accessible signal lead attached to said package; and an integrated circuit chip mounted in said package and connected to said externally accessible signal lead, said integrated circuit chip including:

a mode-selective signal generating circuit coupled to said externally accessible signal lead and configured to receive a mode control signal and an internally-generated reference signal produced at a reference signal bus, said mode-selective signal generating circuit comprising a transfer gate coupling said externally accessible signal lead to said reference signal bus and operative to apply a voltage applied to said externally accessible signal lead to a reference voltage node responsive to the mode control signal.

10. A device according to claim 9, wherein said chip further comprising an reference voltage generating circuit operative to generate said internally-generated reference signal and to receive power from a power supply bus responsive to a control signal.

11. A method of operating a packaged integrated circuit device including an integrated circuit chip including a memory circuit including a bit line coupled to a sense amplifier and a mode-selective signal generating circuit configured to receive a mode control signal and an internal signal and coupled to an externally accessible signal lead, the mode-selective signal generating circuit operative to produce an output signal responsive to one of the internal signal or an external signal applied to the externally accessible signal lead based on the mode control signal, the method comprising the steps of:

transitioning the mode control signal from a first state to a second state;

responsively generating an output signal from the mode-selective signal generating circuit according to an external signal applied to the externally accessible signal lead; and applying the output signal to the sense amplifier to initiate sensing of a voltage on the bit line.

12. A method according to claim 11, wherein said step of applying the output signal to the sense amplifier is followed by the steps of:

transitioning the mode control signal from the second state to the first state;

responsively generating an output signal from the mode-selective signal generating circuit according to the internal signal; and applying the output signal generated according to the internal signal to initiate sensing of a voltage on the bit line.

13. A method of operating a packaged integrated circuit device including an integrated circuit chip including a mode-selective signal generating circuit coupled to an externally accessible signal lead and configured to receive a mode control signal and an internal reference signal generated on the integrated circuit chip, the mode-selective signal generating circuit operative to drive a signal bus with one of the internal reference signal or an external reference signal applied to said externally accessible signal lead based on the mode control signal, the method comprising the steps of:

transitioning the mode control signal from a first state to a second state; and then responsively conveying an external reference signal applied to the externally accessible signal lead to the integrated circuit chip.

* * * * *

UNITED STATES PATENT AND TRADEMARK OFFICE
CERTIFICATE OF CORRECTION

PATENT NO. : 6,553,520 B1
DATED : April 22, 2003
INVENTOR(S) : Seong-kue Jo

It is certified that error appears in the above-identified patent and that said Letters Patent is hereby corrected as shown below:

Column 3,
Line 44, please add the following:
-- FIGs. 10-11 are block diagrams illustrating mode-selective circuits for generating reference voltages according to embodiments of the present invention. --

Signed and Sealed this

Ninth Day of September, 2003

JAMES E. ROGAN
*Director of the United States Patent and Trademark Office*